(12) United States Patent
Kim et al.

(10) Patent No.: US 10,229,849 B2
(45) Date of Patent: Mar. 12, 2019

(54) SUBSTRATE PROCESSING APPARATUS ARRANGED IN PROCESS CHAMBER AND OPERATING METHOD THEREOF

(71) Applicant: JUSUNG ENGINEERING CO., LTD., Gwangju-si, Gyeonggi-do (KR)

(72) Inventors: Ki Bum Kim, Gwangju-si (KR); Seung Youb Sa, Bucheon-si (KR); Ram Woo, Gwangju-si (KR); Myung Jin Lee, Gunpo-si (KR); Seung Dae Choi, Yongin-si (KR); Jong Sung Choi, Anyang-si (KR); Ho Boem Her, Incheon (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 15/573,480

(22) PCT Filed: May 10, 2016

(86) PCT No.: PCT/KR2016/004842
§ 371 (c)(1),
(2) Date: Nov. 12, 2017

(87) PCT Pub. No.: WO2016/182299
PCT Pub. Date: Nov. 17, 2016

(65) Prior Publication Data
US 2018/0144968 A1 May 24, 2018

(30) Foreign Application Priority Data

May 11, 2015 (KR) .......... 10-2015-0065094
Jul. 9, 2015 (KR) .......... 10-2015-0097515

(51) Int. Cl.
| | | |
|---|---|---|
| *B25B 11/00* | (2006.01) | |
| *H01L 21/683* | (2006.01) | |
| *H01L 21/687* | (2006.01) | |

(52) U.S. Cl.
CPC ...... *H01L 21/683* (2013.01); *H01L 21/68764* (2013.01); *H01L 21/68771* (2013.01); *H01L 21/68785* (2013.01); *H01L 21/68792* (2013.01)

(58) Field of Classification Search
CPC .......... H01L 21/6776; H01L 21/67763; H01L 21/67769; H01L 21/6779; H01L 21/68
See application file for complete search history.

(56) References Cited

U.S. PATENT DOCUMENTS

2013/0267094 A1* 10/2013 Katsunuma ....... H01L 21/31138
                                                        438/694
2016/0138159 A1*  5/2016 Kato ................... C23C 16/4584
                                                        118/730

(Continued)

FOREIGN PATENT DOCUMENTS

JP   2009206288 A   9/2009
KR   20090079510 A  7/2009

(Continued)

*Primary Examiner* — Lee D Wilson
(74) *Attorney, Agent, or Firm* — Renaissance IP Law Group LLP

(57) ABSTRACT

Disclosed is a substrate processing apparatus including a disc provided so as to be rotatable on its axis, at least one susceptor disposed on the disc such that a substrate is seated on an upper surface thereof, the susceptor being configured to rotate on its axis and to revolve around a center of the disc as the disc rotates on its axis, a metal ring coupled to a lower portion of the susceptor, the metal ring being arranged such that a center thereof coincides with a center of the susceptor, and a magnet provided below the disc so as to be radially arranged on a basis of the center of the disc, at least a portion (Continued)

of the magnet being opposite the metal ring in a vertical direction.

18 Claims, 7 Drawing Sheets

(56) References Cited

U.S. PATENT DOCUMENTS

2017/0067160 A1\* 3/2017 Kato .................. C23C 16/402
2018/0144968 A1\* 5/2018 Kim .................. H01L 21/683

FOREIGN PATENT DOCUMENTS

| KR | 20090116236 A | 11/2009 |
| KR | 20110116901 A | 10/2011 |
| KR | 20130061802 A | 6/2013 |

\* cited by examiner

SUBSTRATE PROCESSING APPARATUS ARRANGED IN PROCESS CHAMBER AND OPERATING METHOD THEREOF

TECHNICAL FIELD

Embodiments relate to a substrate processing apparatus arranged in a process chamber and an operating method thereof.

BACKGROUND ART

The disclosure described in this part merely provides background information related to embodiments, and does not constitute the related art.

Generally, semiconductor memory devices, liquid crystal display apparatuses, organic light emitting apparatuses, and the like are manufactured by performing a plurality of semiconductor processes on a substrate so as to deposit and stack a structure having a desired shape.

Examples of semiconductor processes include a process of depositing a prescribed thin film on a substrate, a photolithography process of exposing a selected area of the thin film, and an etching process of removing the thin film from the selected area. These semiconductor processes are performed within a process chamber in which an optimum environment is created for a corresponding process.

Generally, an apparatus for processing a circular substrate, such as a wafer, is placed in the process chamber, and is configured such that a plurality of circular susceptors is mounted on a circular disc, which is larger than the susceptors.

In the substrate processing apparatus, after a substrate is seated on the susceptor, the disc rotates on its axis and the susceptor rotates on its axis and also revolves around the center of the disc. Thereafter, the processing of the substrate is performed in such a manner that a source material is ejected onto the substrate so as to enable the deposition, stacking, or etching of a structure, which has a desired shape, on the substrate.

At this time, an additional device for ejecting air or any other gas is used, in order to allow the susceptor to rotate on its axis. In this case, foreign substances contained in the air or gas may be problematically adsorbed on the substrate, causing defective products.

DISCLOSURE

Technical Problem

Accordingly, an object of embodiments is to provide a substrate processing apparatus, which is placed in a process chamber and is capable of rotating a susceptor on its axis without using an additional device for ejecting air or any other gas, and an operating method thereof.

The technical objects to be accomplished by the embodiments are not limited to the aforementioned technical object, and other unmentioned technical objects will be clearly understood from the following description by those having ordinary skill in the art.

Technical Solution

In one embodiment, a substrate processing apparatus includes a disc provided so as to be rotatable on its axis, at least one susceptor disposed on the disc such that a substrate is seated on an upper surface thereof, the susceptor being configured to rotate on its axis and to revolve around a center of the disc as the disc rotates on its axis, a metal ring coupled to a lower portion of the susceptor, the metal ring being arranged such that a center thereof coincides with a center of the susceptor, and a magnet provided below the disc so as to be radially arranged on a basis of the center of the disc, at least a portion of the magnet being opposite the metal ring in a vertical direction.

In the embodiment, the substrate processing apparatus may further include a bearing disposed so as to come into contact with each of the disc and the susceptor, and a frame having a receiving portion for receiving the disc, and the metal ring may rotate on its axis by magnetic force of the magnet as the disc rotates on its axis, whereby the susceptor rotates on its axis.

In the embodiment, the susceptor may include a first support portion protruding from a lower surface thereof, the first support portion being coupled to the metal ring and being configured to support the bearing.

The metal ring may include an inner ring coupled to the first support portion, an outer ring coupled to the inner ring, and a ring coupling portion formed between the outer ring and the inner ring for coupling the outer ring and the inner ring to each other.

The outer ring may be opposite the magnet in the vertical direction, and may have a greater width than a width of the magnet.

The outer ring may be opposite the magnet in the vertical direction, and may include a region opposite the magnet for covering the entire magnet in the vertical direction.

The magnet may be radially arranged on the frame on a basis of a center of the receiving portion so as not to rotate.

The magnet may include a plurality of pieces radially arranged at a constant interval.

The pieces may have a cylindrical shape.

In the embodiment, the substrate processing apparatus may further include a shaft inserted into a through-hole formed in a central region of the receiving portion for rotating the disc on its axis, and a disc support portion coupled at a lower side thereof to an upper end of the shaft and at an upper side thereof to the disc.

In the embodiment, a speed at which the susceptor rotates on its axis may be proportional to a ratio of a diameter of the metal ring to a diameter of the magnet.

The diameter of the magnet may be a value obtained by measuring in a diametrical direction a distance between opposite points on a width center of the magnet arranged in a ring shape, and the diameter of the metal ring may be a value obtained by measuring in a diametrical direction a distance between opposite points on a width center of the metal ring.

The metal ring may be formed of a ferromagnetic material.

A direction in which the disc rotates on its axis may be the same as a direction in which the susceptor rotates on its axis.

The magnet, provided below the disc so as to be radially arranged on the basis of the center of the disc, may have a center spaced apart from a center of the metal ring.

In another embodiment, a substrate processing apparatus includes a disc provided so as to be rotatable, a susceptor disposed on the disc such that a substrate is seated on an upper surface thereof, the susceptor being configured to rotate on its axis and to revolve around a center of the disc as the disc rotates, a metal ring coupled to a lower portion of the susceptor, the metal ring being arranged such that a center thereof coincides with a center of the susceptor, and a magnet provided below the disc so as to be radially arranged on a basis of the center of the disc, the magnet being opposite the metal ring in a vertical direction, wherein the susceptor rotates on its axis in the same direction as a direction in which the disc rotates on its axis as the disc rotates on its axis.

The metal ring may include a region for covering, in the vertical direction, the entire magnet having a ring shape.

In another embodiment, a substrate processing apparatus includes a disc provided so as to be rotatable, a susceptor disposed on the disc such that a substrate is seated on an upper surface thereof, the susceptor being configured to rotate on its axis and to revolve around a center of the disc as the disc rotates, a metal ring coupled to a lower portion of the susceptor, the metal ring being arranged such that a center thereof coincides with a center of the susceptor, and a magnet provided below the disc so as to be radially arranged on a basis of the center of the disc, the magnet being opposite the metal ring in a vertical direction, wherein a speed at which the susceptor rotates on its axis is proportional to a ratio of a diameter of the metal ring to a diameter of the magnet.

In another embodiment, a substrate processing apparatus includes a disc provided so as to perform first rotation, at least one susceptor disposed on the disc such that a substrate is seated on an upper surface thereof, the susceptor being configured to perform the first rotation and to perform second rotation around a center of the disc as the disc performs the first rotation, a metal ring coupled to a lower portion of the susceptor, the metal ring being arranged such that a center thereof coincides with a center of the susceptor, and a magnet provided below the disc so as to be radially arranged on a basis of the center of the disc, at least a portion of the magnet being opposite the metal ring in a vertical direction.

In a further embodiment, a method of operating a substrate processing apparatus includes rotating a disc on its axis, revolving a susceptor around a center of the disc as the disc rotates on its axis, revolving a metal ring, which is coupled to a lower portion of the susceptor, around the center of the disc as the susceptor revolves around the center of the disc, magnetically attracting the metal ring using a magnet, the metal ring and the magnet being opposite each other in a vertical direction, and causing the susceptor, which is coupled to the metal ring, to be attracted and rotated on its axis by the magnet due to magnetic attraction between the magnet and the metal ring.

Advantageous Effects

According to the embodiments, because a susceptor may rotate on its axis without additional susceptor rotation equipment using air or gas, the configuration of a substrate processing apparatus may be simplified, and the consumption of electrical power used in the processing of a substrate may be reduced.

In addition, the incidence of defective products, caused when foreign substances contained in air or gas are adsorbed on, for example, a substrate, such as a wafer, when rotation equipment using air or gas is used, may be remarkably reduced.

In addition, by limiting vibration and noise generated during the rotation of a susceptor, the shaking of a substrate seated on the upper surface of the susceptor, uneven deposition on the substrate, and the generation of etching may be limited.

BEST MODE

Figure 1:
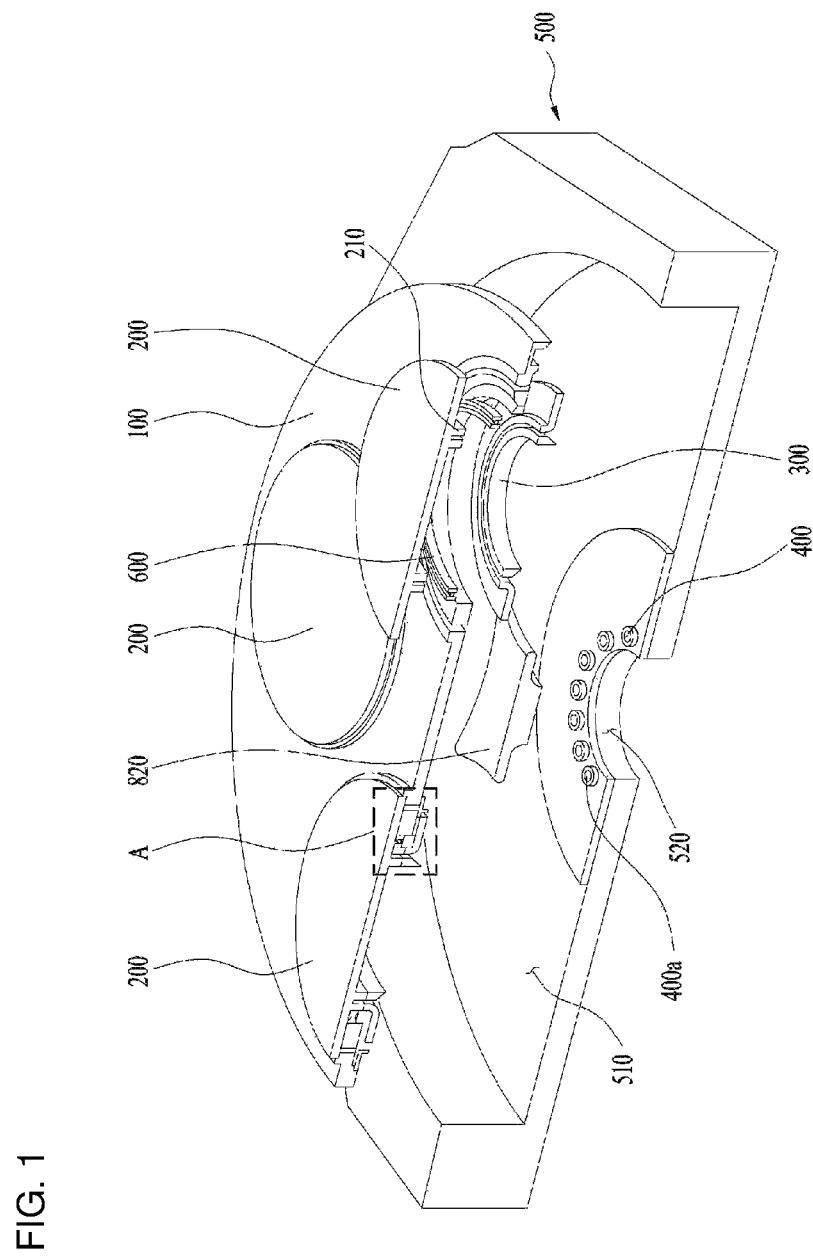
FIG. 1 is a sectional perspective view illustrating a substrate processing apparatus in accordance with one embodiment.

Hereinafter, embodiments will be described in detail with reference to the accompanying drawings. The embodiments may be changed in various ways and may have various forms, and specific embodiments will be illustrated in the drawings and will be described below in detail. However, it should be understood that the illustration and description are not intended to limit the embodiments to specific disclosed forms, but include all modifications, equivalents, and substitutions included in the scope and spirit of the embodiments. In this course, the sizes or shapes of elements illustrated in the drawings may be exaggerated for clarity and convenience.

The terms "first", "second" and the like may be used to describe various elements, but the elements should not be limited by the terms. The terms are used only in order to distinguish between any one element and other elements. In addition, the terms particularly defined in consideration of the configuration and operation of the embodiments are merely given to describe the embodiments, and are not intended to limit the scope of the embodiments.

In the description of the embodiments, it will be understood that, when an element is referred to as being "on" or "under" another element, it can be "directly" on or under another element or can be "indirectly" formed such that an intervening element may also be present. In addition, it will also be understood that, when an element is described as being "on" or "under" another element, this may include the meaning of upward as well as downward on the basis of one element.

In addition, the relative terms "top/upper/above", "bottom/lower/under" and the like in the description and in the claims may be used to distinguish between any one substance or element and other substances or elements and not necessarily for describing any physical or logical relationship between the substances or elements or a particular order.

Figure 2:
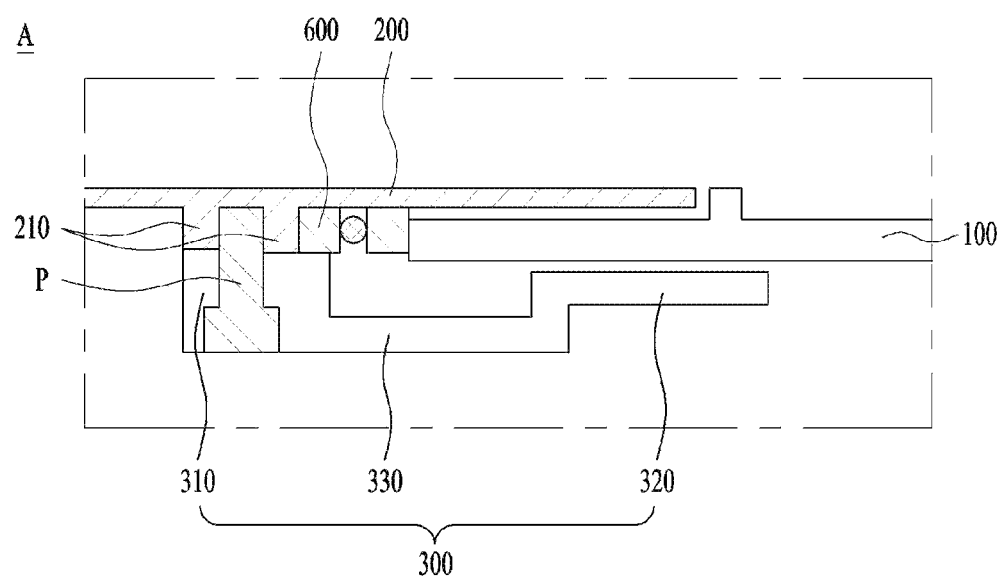
FIG. 2 is a sectional view illustrating portion A of FIG. 1.

FIG. 1 is a sectional perspective view illustrating a substrate processing apparatus in accordance with one embodiment. FIG. 2 is a sectional view illustrating portion A of FIG. 1. The substrate processing apparatus of the embodiment may include a disc 100, a susceptor 200, a metal ring 300, a magnet 400, a bearing 600, and a frame 500.

The disc 100 may be accommodated in a receiving portion 510 defined in the frame 500 so as to perform first rotation, i.e. rotation on its axis relative to the frame 500. The susceptor 200, which will be described below, may be symmetrically arranged on the disc 100 on the basis of the center of the disc 100.

The disc 100 may be mounted on the frame 500, as illustrated in FIG. 1. At this time, the receiving portion 510 may be formed in the frame 500 into an area and shape corresponding to the shape and area of the disc 100, so that the disc 100 may be seated in the receiving portion 510.

Meanwhile, in the case where the susceptor 200 is provided on the disc 100, the susceptor 200 may be radially arranged on the disc 100 in various numbers depending on the size of the susceptor 200. In addition, a disc seating region may be indented in the upper portion of the disc 100 into an area and shape corresponding to the shape and area of the susceptor 200, so that the susceptor 200 may be seated in the disc seating region.

The susceptor 200 may be disposed on the disc 100 and may be configured such that a substrate is seated on the upper surface thereof. As the disc 100 rotates on its axis, the susceptor 200 may rotate on its axis and may also perform second rotation, i.e. revolution around the center of the disc 100. At this time, the susceptor 200 may rotate on its axis by magnetic force acting between the metal ring 300 and the magnet 400. This will be described below.

A substrate (not illustrated) may be seated on the upper surface of the susceptor 200. At this time, in the case where the susceptor 200 has a circular shape as in the embodiment, the substrate may be, for example, a circular wafer. Accordingly, the substrate, such as a wafer, seated on the upper surface of the susceptor 200 may be processed by ejecting process gas including, for example, a source material onto the substrate.

In addition, because the susceptor 200 rotates on its axis, and simultaneously, revolves around the center of the disc 100, a film may be deposited or etched on the circular substrate, seated on the susceptor 200, so as to be symmetrical in the diametric direction on the basis of the center of the circular substrate.

Meanwhile, a first support portion 210 may be provided underneath the susceptor 200. The first support portion 210 may protrude from the lower surface of the susceptor 200, may be coupled to the metal ring 300, and may serve to support the bearing 600.

As illustrated in FIG. 2, the first support portion 210 may protrude from the lower surface of the susceptor 200, and may define a recess, into which a coupling piece P may be inserted. Meanwhile, the metal ring 300 may be provided, in a region for coupling with the first support portion 210, with a hole, into which the coupling piece P may be inserted.

Meanwhile, a plurality of coupling pieces P may be radially coupled to the metal ring 300 and the first support portion 210. Accordingly, the recess in the first support portion 210 and the hole in the metal ring 300 may be provided in a number equal to or greater than the number of the coupling pieces P.

In this way, the metal ring 300 may be coupled to the first support portion 210 via the coupling piece P to thereby be coupled to the lower portion of the susceptor 200. As will be described below, the metal ring 300 may be fixedly coupled to the susceptor 200 so as to be rotated by the magnetic force of the magnet 400, whereby the susceptor 200 may rotate on its axis.

The metal ring 300 may be coupled to the lower portion of the susceptor 200, the metal ring 300 may be arranged such that the center of the metal ring 300 coincides with the center of the susceptor 200. With this configuration, when the metal ring 300 rotates via the rotation of the magnet 400, the susceptor 200 may rotate on its axis at the consistent rotational speed, which is the same as the rotational speed of the metal ring 300.

The metal ring 300 may be formed of, for example, a metal, such as iron, nickel, cobalt, or a ferromagnetic material containing the same, in order to intensively respond to the magnetic force of the magnet 400.

Meanwhile, as illustrated in FIG. 2, the metal ring 300 may include an inner ring 310, an outer ring 320, and a ring coupling portion 330. The inner ring 310 may be provided with the hole, and thus may be coupled to the first support portion 210 using the coupling piece P. The outer ring 320 may be provided outside the inner ring 310 and may be coupled to the inner ring 310 using the ring coupling portion 330.

At this time, in one embodiment, the outer ring 320 may be opposite, in the vertical direction, the magnet 400, which is provided below the outer ring 320. With this configuration, magnetic force may mainly act between the magnet 400 and the outer ring 320.

The ring coupling portion 330 may be formed between the outer ring 320 and the inner ring 310 and may serve to couple the outer ring 320 and the inner ring 310 to each other. At this time, the inner ring 310, the outer ring 320, and the ring coupling portion 330 may be integrally formed with one another via, for example, injection molding or casting.

The bearing 600 may be located so as to come into contact with each of the disc 100 and the susceptor 200, and may serve to assist the susceptor 200 in smoothly rotating on its axis relative to the disc 100.

As illustrated in FIG. 2, the bearing 600 may be, for example, a ball bearing. The ball bearing may include an inner ring, an outer ring, and a ball interposed between the inner ring and the outer ring so as to come into point contact with the inner ring and the outer ring.

The inner ring may be supported by the first support portion 210 and the metal ring 300, and the outer ring may be supported by the disc 100. With this configuration, the bearing 600 may assist the susceptor 200 in smoothly rotating on the disc 100.

The magnet 400 may be radially arranged under the disc 100 on the basis of the center of the disc 100, and may be opposite the metal ring 300 in the vertical direction. When the disc 100 is rotated by the magnetic force acting between the magnet 400 and the metal ring 300, the magnet 400 may rotate the metal ring 300, thereby rotating the susceptor 200 coupled to the metal ring 300.

The magnet 400 may be disposed below the metal ring 300 so as not to rotate. For example, the magnet 400 may be located in the receiving portion 510, which is circularly formed in the frame 500, and may be radially arranged on the basis of the center of the receiving portion 510.

In the case where the magnet 400 is radially arranged on the basis of the center of the receiving portion 510, because the magnet 400 applies even magnetic force to each metal ring 300, which is coupled to each susceptor 200, the speed at which the susceptor 200 rotates on its axis may be evenly controlled so long as the speed at which the disc 100 rotates on its axis is even.

In addition, the magnet 400 may be opposite and spaced apart from the metal ring 300 in the vertical direction. In one embodiment, the magnet 400 may be opposite and spaced apart from at least a portion of the outer ring 320 of the metal ring 300 in the vertical direction.

In addition, the magnet 400 may include a plurality of pieces 400a, which are radially arranged at a constant interval. Each piece 400a may have a cylindrical shape, and may be, for example, a permanent magnet.

The pieces 400a may be radially arranged at a constant interval, and each piece 400a may create a magnetic field, which is distinguished from that of the other pieces 400a. The pieces 400a are gathered to form the magnet 400, which is a permanent magnet for creating a magnetic field.

The disc 100 may be seated on the frame 500, and to this end, the frame 500 may include the receiving portion 510. At this time, although the disc 100 seated in the receiving portion 510 may rotate relative to the frame 500, in an alternative, the frame 500 may be configured so as not to rotate relative to the disc 100.

The receiving portion 510 may be formed in the frame 500 into a shape and size corresponding to the shape and size of the disc 100. As described above, the magnet 400 may be radially arranged on the bottom of the receiving portion 510 on the basis of the center of the receiving portion 510.

In addition, a through-hole 520 may be formed in the central region of the receiving portion 510. At this time, a shaft (not illustrated), which is connected to the disc 100 so as to rotate the disc 100 on its axis, may be inserted into the through-hole 520.

The shaft may be inserted into the through-hole 520 and may be rotated by an external power device. Accordingly, the disc 100 connected to the shaft may rotate on its axis as the shaft rotates.

Meanwhile, the shaft and the disc 100 may be connected to each other using a disc support portion 820. The lower end of the disc support portion 820 may be coupled to the upper end of the shaft, and the upper end of the disc support portion 820 may be coupled to the disc 100, whereby the shaft and the disc 100 may be connected to each other. At this time, the shaft, the disc support portion 820, and the disc 100 may be separably coupled to each other using appropriate coupling mechanisms.

Figure 3:
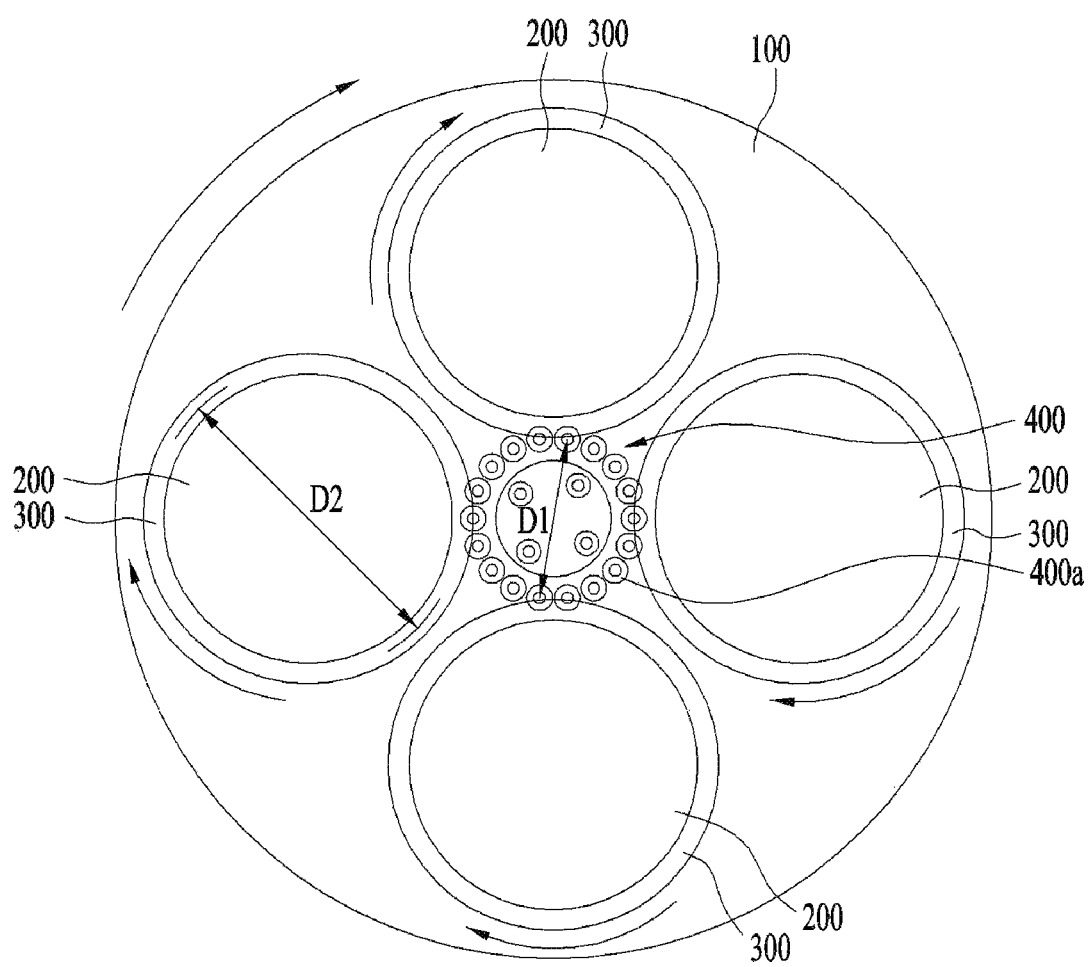
FIGS. 3 and 4 are schematic bottom views for the explanation of operations of a disc and a susceptor in accordance with one embodiment.
Figure 4:
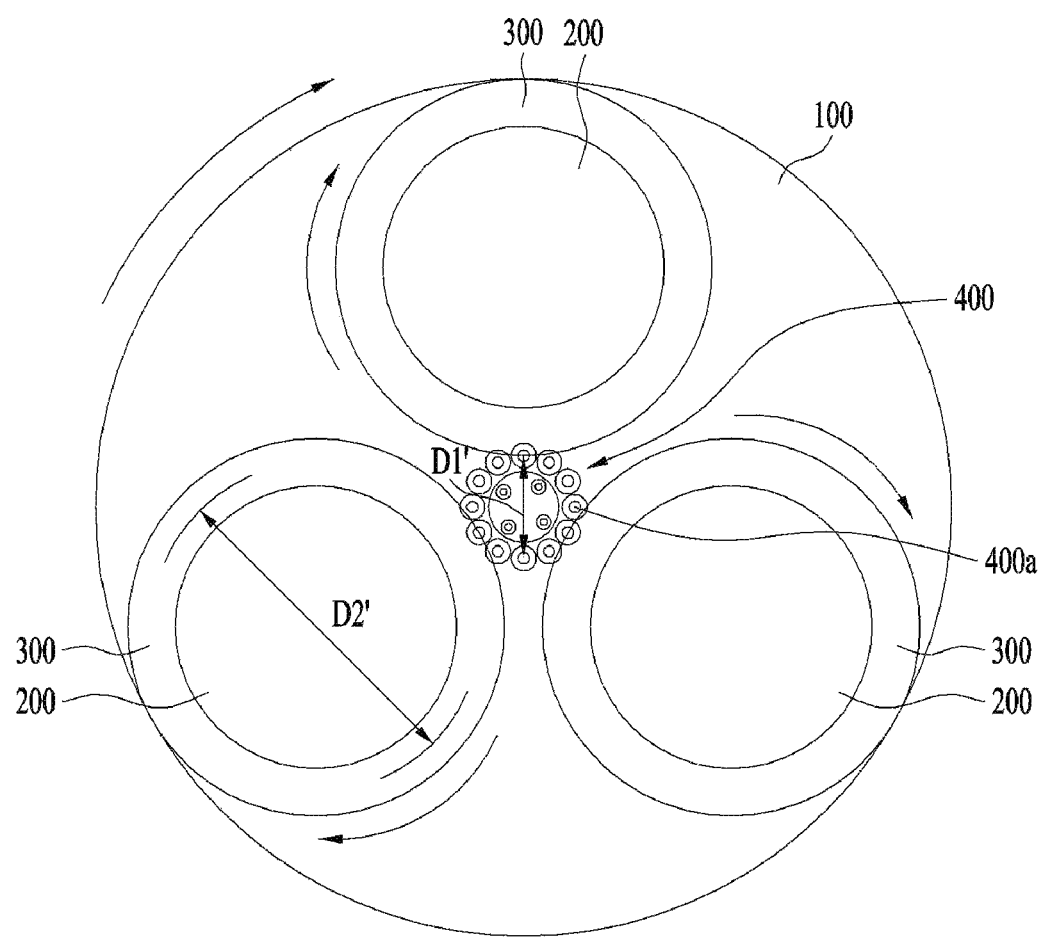

FIGS. 3 and 4 are schematic bottom views for the explanation of operations of the disc 100 and the susceptor 200 in accordance with one embodiment. At this time, the direction in which the disc 100 rotates on its axis may be the same as the direction in which the susceptor 200 rotates on its axis.

As illustrated in FIGS. 3 and 4, the center of the magnet 400 and the center of the metal ring 300 may be spaced apart from each other.

This is because, in the case where the center of the magnet 400 and the center of the metal ring 300 coincide with each other, the magnetic force of the magnet 400 may be evenly distributed in the circumferential direction of the metal ring 300, and this configuration may prevent the susceptor 200 from rotating on its axis even if the disc 100 rotates on its axis.

At this time, for example, as illustrated in FIGS. 3 and 4, when viewing the lower surface of the disc 100, the susceptor 200 and the metal ring 300 coupled thereto may rotate in the direction designated by the arrows, i.e. in the clockwise direction when the disc 100 rotates on its axis in the direction designated by the arrows, i.e. in the clockwise direction.

At this time, because magnetic force acts between the metal ring 300 and the magnet 400, the metal ring 300 may be rotated in the clockwise direction by the magnetic force as the disc 100 rotates on its axis in the clockwise direction, and simultaneously, the susceptor 200, which is fixedly coupled to the metal ring 300, may be rotated in the clockwise direction.

That is, the metal ring 300 and the magnet 400 may realize a magnet coupling, which is operated like the engagement of two gears, by the magnetic force. Accordingly, the fixed magnet 400 may function similar to a fixed gear, and the metal ring 300 may be engaged with and rotated by the magnet 400.

Accordingly, in the case where the disc 100 rotates in the clockwise direction as in the embodiment, the metal ring 300 may rotate in the clockwise direction as if it were engaged with and rotated by a fixed gear.

Likewise, in another embodiment, in the case where the disc 100 rotates on its axis in the counterclockwise direction, the susceptor 200 and the metal ring 300 may revolve in the counterclockwise direction around the center of the disc 100, and simultaneously, may rotate on their axes in the counterclockwise direction.

For the reason described above, in conclusion, the rotation direction of the disc 100 and the rotation direction of the susceptor 200 may be the same as each other.

Meanwhile, the speed at which the susceptor 200 rotates on its axis may be proportional to the ratio of the diameter of the metal ring 300 to the diameter of the magnet 400.

At this time, for example, the diameter of the magnet 400 may be defined as the value obtained by measuring in a diametrical direction the distance between opposite points on a width center of the magnet 400 arranged in a ring form, and the diameter of the metal ring 300 may be defined as the value obtained by measuring in a diametrical direction the distance between opposite points on a width center of the metal ring 300.

Comparing FIGS. 3 and 4 with each other, the diameter D1 of the magnet 400 in FIG. 3 is longer than the diameter D1' of the magnet 400 in FIG. 4. In addition, the diameter D2 of the metal ring 300 in FIG. 3 is shorter than the diameter D2' of the metal ring 300 in FIG. 4. That is, the relationship D1>D1' and the relationship D2<D2' are established.

In the conditions described above, when the diameter of the disc 100 and the speed at which the disc 100 rotates on its axis are the same in FIGS. 3 and 4, the ratio of the diameter D2 of the metal ring 300 to the diameter D1 of the magnet 400 in FIG. 3 is smaller than the ratio of the diameter D2' of the metal ring 300 to the diameter D1' of the magnet 400 in FIG. 4.

Accordingly, the speed at which the magnet 400 and the susceptor 200 rotate on their axes in FIG. 3 is faster than the speed at which the magnet 400 and the susceptor 200 rotate on their axes in FIG. 4. As described above, the speed at which the susceptor 200 rotates on its axis may be controlled by appropriately adjusting the ratio of the diameter of the metal ring 300 to the diameter of the magnet 400.

Of course, in addition to the method described above, the speed at which the susceptor 200 rotates on its axis may be appropriately controlled by, for example, adjusting the speed at which the disc 100 rotates on its axis.

Figure 5:
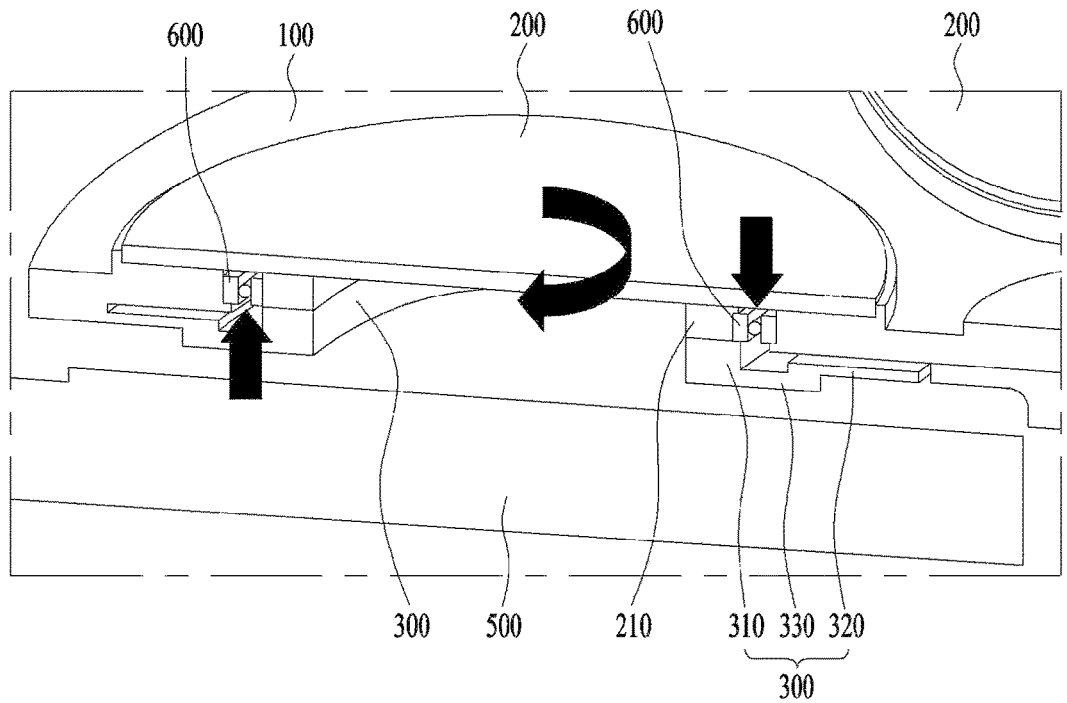
FIG. 5 is a sectional perspective view illustrating a portion of a substrate processing apparatus in accordance with one embodiment.
Figure 6:
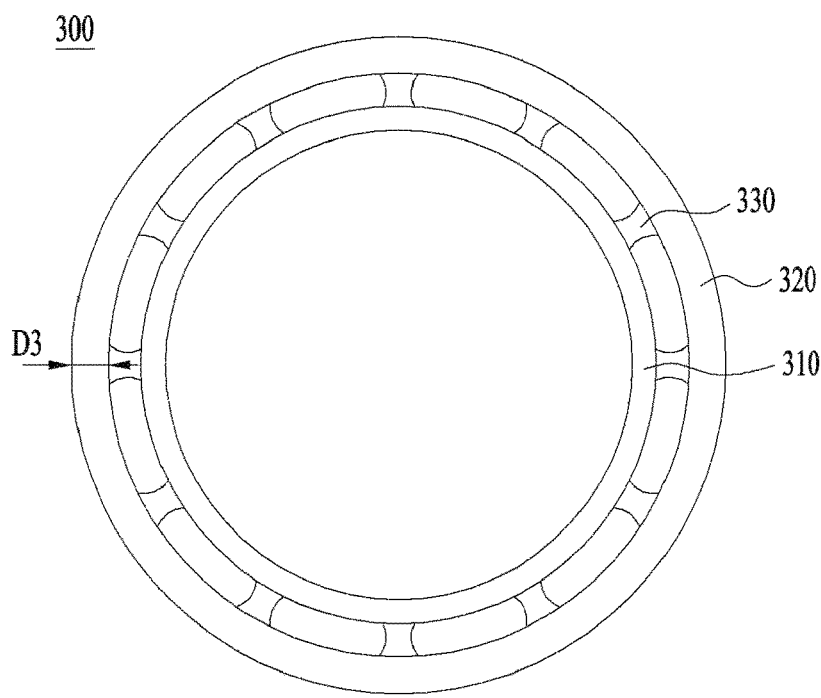
FIG. 6 is a plan view illustrating a metal ring in accordance with one embodiment.
Figure 7:
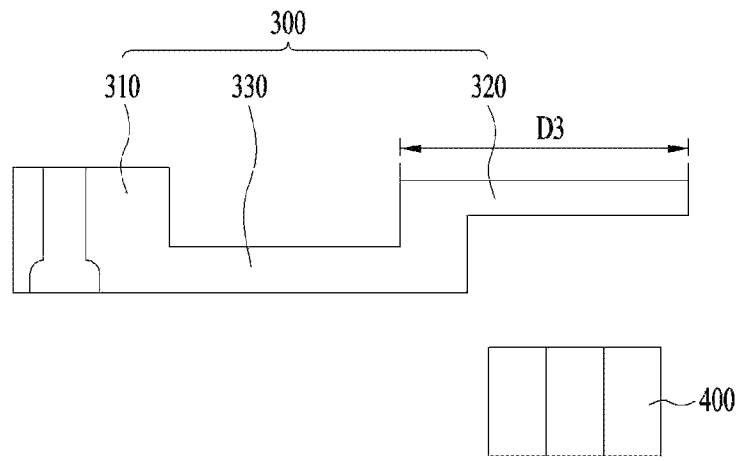
FIG. 7 is a view for the explanation of the arrangement of a metal ring and a magnet in accordance with one embodiment.

FIG. 5 is a sectional perspective view illustrating a portion of the substrate processing apparatus in accordance with one embodiment. FIG. 6 is a plan view illustrating the metal ring 300 in accordance with one embodiment. FIG. 7 is a view for the explanation of the arrangement of the metal ring 300 and the magnet 400 in accordance with one embodiment. For clear description, in FIG. 6, the hole in the inner ring 310, into which the coupling piece P is inserted, is not illustrated.

As illustrated in FIG. 5, for example, in the case where the susceptor 200 rotates in the manner designated by the curved arrow, the rotating susceptor 200 may be subjected to an eccentric load by the magnetic force of the magnet 400.

That is, the region of the susceptor 200 that is opposite the magnet ring 300 and the magnet 400 may be affected by the magnetic force, and the diametrically opposite region of the metal ring 300 that is opposite only the metal ring 300 may be substantially unaffected by the magnetic force of the magnet 400.

With this configuration, the region of the susceptor 200 that is opposite both the metal ring 300 and the magnet 400 may tilt downward as designated by the downward arrow, and the region of the susceptor 200 that is opposite only the metal ring 300 may tilt upward as designated by the upward arrow.

With this tilting, the susceptor 200 may undergo vibration and noise when it rotates on its axis. In particular, vibration generated when the susceptor 200 rotates on its axis may cause the shaking of a substrate seated on the upper surface of the susceptor 200, the uneven deposition of a film on the substrate, and the unwanted etching of the film, which may result in defective products.

Therefore, it is necessary to limit the vibration and noise of the susceptor 200 described above. This may be achieved by improving the configuration of the metal ring 300. Generally, the magnitude of magnetic force is represented by the following Equation.

Math equation 1

$$F = k \frac{m_1 m_2}{r^2} \quad \text{[Equation 1]}$$

where,

F: the magnitude of magnetic force,
k: a proportional constant,
$m_1$, $m_2$: magnetic charge,
r: the distance between two magnetic poles,
represents each other.

In the embodiment, the distance r between the two magnetic poles may mean the distance between the magnet 400 and the metal ring 300, which are opposite each other. In addition, the multiplication of the magnetic charge $m_1 m_2$ may be increased as the area of the opposing regions of the magnet 400 and the metal ring 300 is increased.

In the embodiment, vibration and noise, occurring when the susceptor 200 rotates on its axis, may be limited by increasing the magnetic force acting between the magnet 400 and the metal ring 300. That is, when the magnetic force is increased, vibration occurring when the susceptor 200 rotates on its axis may be limited by the magnetic force, and consequently, the generation of noise attributable to the vibration may be limited.

The multiplication of the magnetic charge $m_1 m_2$ may be increased in order to increase the magnetic force. To this end, the area of the opposing regions of the magnet 400 and the metal ring 300 may be increased.

In order to increase the area of the opposing regions of the magnet 400 and the metal ring 300, for example, the metal ring 300 may be configured so as to have a region for covering, in the vertical direction, the entire magnet 400, which has a ring shape.

Specifically, as illustrated in FIGS. 6 and 7, for example, the region of the metal ring 300, which corresponds to the magnet 400 in the vertical direction, may be the outer ring 320, and the width D3 of the outer ring 320 may be greater than the width of the magnet 400.

With this configuration, the region of the outer ring 320 that is opposite the magnet 400 may be configured so as to cover the entire magnet 400 in the vertical direction.

In the case of the configuration described above, the multiplication of the magnetic charge $m_1 m_2$ may be increased, compared to the configuration in which the outer ring 320 covers a portion of the magnet 400 in the vertical direction at the opposing regions of the magnet 400 and the metal ring 300. Accordingly, considering the above Equation 1, the magnitude of magnetic force may be increased.

When the magnitude of magnetic force is increased, as described above, vibration and noise occurring when the susceptor 200 rotates on its axis may be limited.

Figure 8:
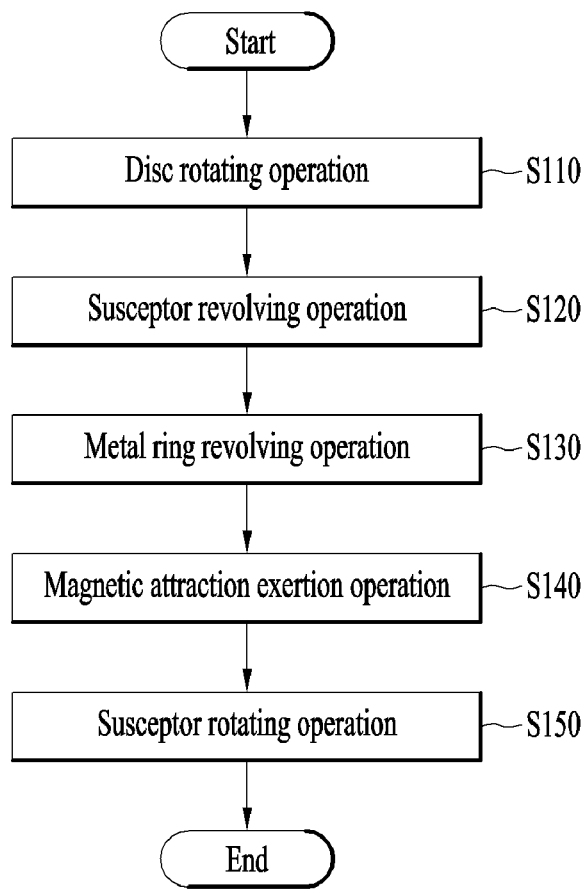
FIG. 8 is a flowchart for the explanation of a method of operating the substrate processing apparatus in accordance with one embodiment.

FIG. 8 is a flowchart for the explanation of a method of operating the substrate processing apparatus in accordance with one embodiment. The operating method of the substrate processing apparatus may include an operation S110 of rotating the disc 100 on its axis, an operation S120 of revolving the susceptor 200 around the center of the disc 100, an operation of revolving the metal ring 300 around the center of the disc 100, an operation S140 of exerting magnetic attraction, and an operation S150 of rotating the susceptor 200 on its axis.

In the disc rotating operation S110, the disc 100 may rotate on its axis. At this time, the disc 100 may rotate on its axis as the shaft rotates. The shaft may be rotated on its axis using an electric device, a pneumatic device, or any of various other devices.

In the susceptor revolving operation S120, the susceptor 200 may revolve around the center of the disc 100 as the disc 100 rotates on its axis.

In the metal ring revolving operation S130, the metal ring 300, which is coupled to the lower portion of the susceptor 200, may revolve around the center of the disc 100 as the susceptor 200 revolves around the center of the disc 100.

In the magnetic attraction exertion operation S140, the magnet 400 may magnetically attract the metal ring 300 using magnetic force acting between the metal ring 300 and the magnet 400, which are opposite each other in the vertical direction.

In the susceptor rotating operation S150, the susceptor 200, which is coupled to the metal ring 300, may be magnetically attracted by the magnet 400 so as to rotate on its axis using magnetic force acting between the metal ring 300 and the magnet 400.

At this time, as described above, for example, the susceptor 200 may rotate in the same direction as the rotation direction of the disc 100 by the magnetic force of the magnet 400.

Figure 9:
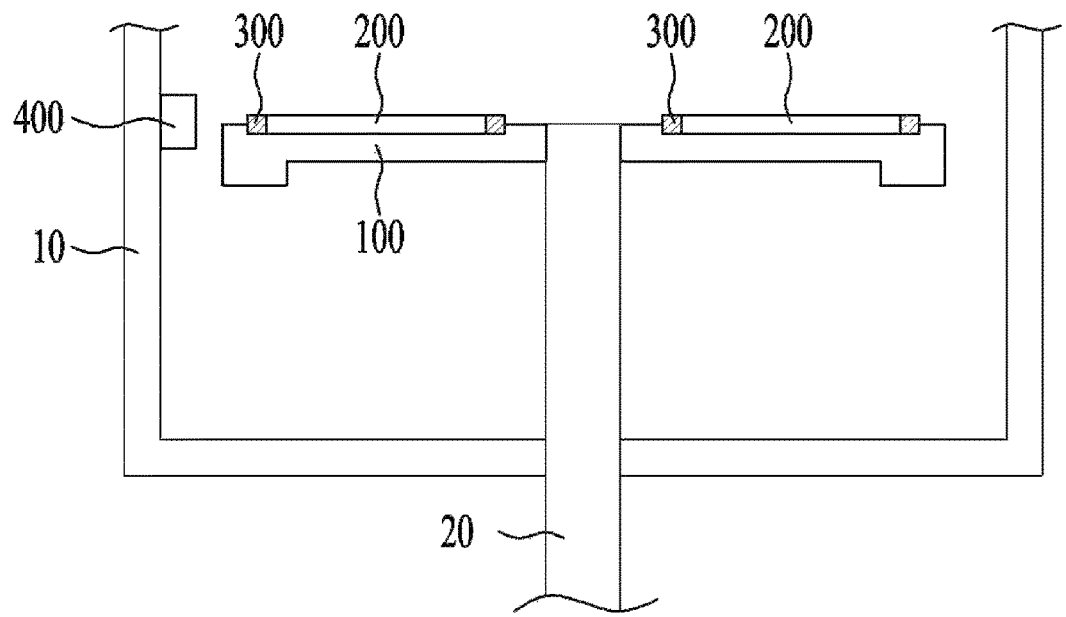
FIG. 9 is a schematic sectional view illustrating the substrate processing apparatus in accordance with another embodiment.

FIG. 9 is a schematic sectional view illustrating the substrate processing apparatus in accordance with another embodiment. The disc 100 and the susceptor 200 may be arranged in a process chamber 10, which includes a reaction space. At this time, the disc 100, the susceptor 200, the metal ring 300, and the magnet 400 may be arranged in the process chamber 10.

The disc 100 may perform first rotation, i.e. rotation on its axis. For example, the disc 100 may perform first rotation as a shaft 20, which is connected to the disc 100, rotates.

At least one susceptor 200 may be disposed on the disc 100 so that a substrate may be seated on the upper surface of the susceptor 200. As the disc 100 performs first rotation, i.e. rotation on its axis, the susceptor 200 may perform not only the first rotation, but also second rotation, i.e. revolution around the center of the disc 100.

At this time, the rotation of the susceptor 200 on its axis may be realized by the magnetic force acting between the metal ring 300 and the magnet 400, as described above. Hereinafter, the configurations and arrangement relationship of the metal ring 300 and the magnet 400 will be described.

As illustrated in FIG. 9, the metal ring 300 may be coupled to the outer circumferential surface of the susceptor 200, and the magnet 400 may be coupled to the inner wall of the process chamber 10 so as to be opposite the metal ring 300 in the lateral direction.

The disc 100 rotates on its axis as the shaft 20 rotates, and in turn, the susceptor 200 may revolve around the center of the disc 100 as the disc 100 rotates on its axis. At this time, the metal ring 300, which is coupled to the susceptor 200, may revolve around the center of the disc 100, and magnetic force may act between the metal ring 300, which revolves around the center of the disc 100, and the magnet 400, which is coupled to the inner wall of the process chamber 10 so as not to rotate.

Owing to this magnetic force, the metal ring 300 may rotate on the center of the susceptor 200, and the susceptor 200, which is coupled to the metal ring 300, may rotate on its axis.

Meanwhile, because the magnet 400 and the metal ring 300 are opposite each other in the lateral direction, vibration and noise occurring when the susceptor 200 rotates on its axis may be limited, compared to the above-described configuration, that is, the configuration in which the magnet 400 and the metal ring 300 are opposite each other in the vertical direction.

Meanwhile, although a plurality of magnets 400 may be radially arranged on the inner wall of the process chamber 10 having a cylindrical shape, one magnet or a plurality of magnets may be arranged in a specific region on the inner wall of the process chamber 10 in an arrangement, other than the radial arrangement.

This is because the metal ring 300 and the susceptor 200 revolve around the center of the disc 100 as the disc 100 rotates on its axis, and therefore, the magnetic force of the magnet 400, which is disposed in a specific region on the inner wall of the process chamber 10, may have an effect on the metal ring 300.

Figure 10:
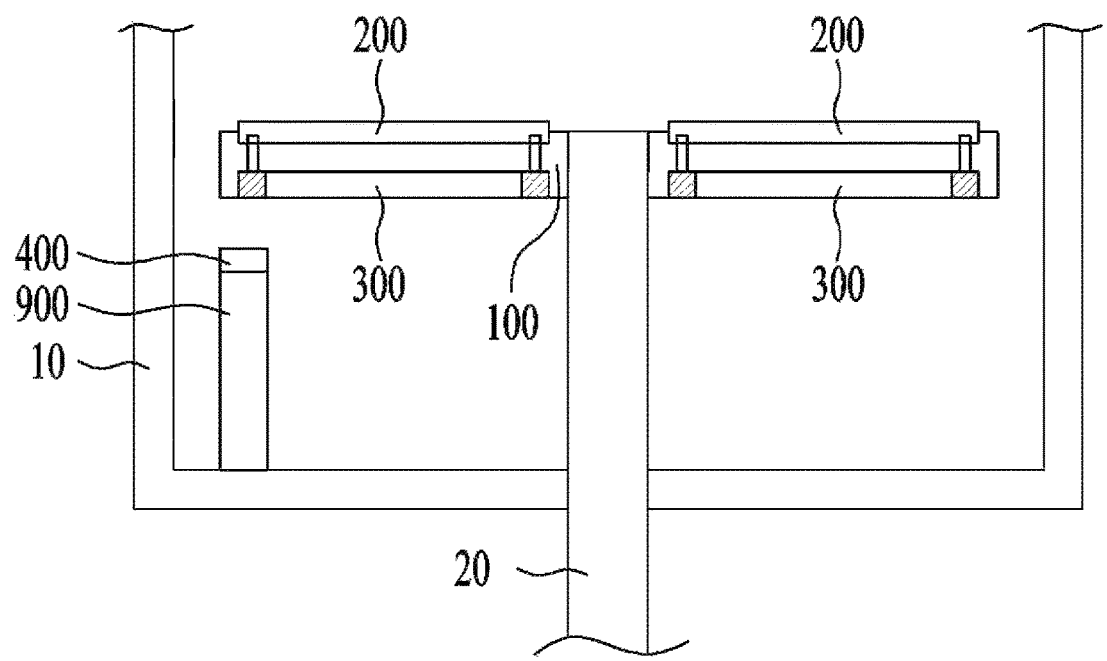
FIG. 10 is a schematic sectional view illustrating the substrate processing apparatus in accordance with a further embodiment.

FIG. 10 is a schematic sectional view illustrating the substrate processing apparatus in accordance with a further embodiment. The embodiment illustrated in FIG. 10 differs from the substrate processing apparatus illustrated in FIGS. 1 to 7 in terms of the arrangement of the magnet 400.

That is, one end of the magnet 400 may be supported by a support pole 900, which is coupled to the process chamber 10, thereby being provided below the metal ring 300 so as to be opposite the metal ring 300 in the vertical direction. That is, the magnet 400 may not be directly coupled to the disc 100 or the susceptor 200, but may be separate from and spaced apart from the disc 100 or the susceptor 200.

Meanwhile, although a plurality of magnets 400 may be radially arranged below the metal ring 300 and the disc 100, one magnet or a plurality of magnets may be arranged in a specific region within the process chamber 10 in an arrangement other than the radial arrangement.

In the same manner as the above description, this is because the metal ring 300 and the susceptor 200 revolve around the center of the disc 100 as the disc 100 rotates on its axis, and therefore, the magnetic force of the magnet 400, which is located in the specific region within the process chamber 10, may have an effect on the metal ring 300.

In the embodiments of FIGS. 9 and 10, because the magnet 400 is separate from and spaced apart from the disc 100 or the susceptor 200, the substrate processing apparatus may be relatively easily manufactured, compared to the case where the magnet 400 is coupled to the disc 100.

In the embodiments, because the susceptor 200 may rotate on its axis without separate rotation equipment using air or gas, the configuration of the substrate processing apparatus may be simplified, and the consumption of electric power used in the processing of a substrate may be reduced.

In addition, in the case of using the rotation equipment using air or gas, the incidence of defective products caused when foreign substances contained in the air or gas are adsorbed on a substrate, such as a wafer, may be remarkably reduced.

In addition, by limiting vibration and noise generated during rotation of the susceptor 200, the shaking of a substrate seated on the upper surface of the susceptor 200, the uneven deposition of a film on the substrate, and the etching of the film may be limited.

Although several embodiments have been described above, various other embodiments are also possible. The technical description of the embodiments described above may be combined in various forms so long as they are not incompatible, and thus, new embodiments may be implemented.

INDUSTRIAL APPLICABILITY

According to the embodiments, because a susceptor may rotate on its axis without additional susceptor rotation equipment using air or gas, the configuration of a substrate processing apparatus may be simplified, and the consumption of electrical power used in the processing of a substrate may be reduced. Therefore, there is an industrial applicability.

The invention claimed is:
1. A substrate processing apparatus comprising:
a disc provided so as to be rotatable with respect to a first axis thereof;
at least one susceptor disposed on the disc such that a substrate is seated on an upper surface thereof, the susceptor being configured to rotate with respect to a second axis thereof and to revolve around a center of the disc as the disc rotates with respect to the first axis;
a metal ring coupled to a lower portion of the susceptor, the metal ring being arranged such that a center thereof coincides with a center of the susceptor;
a magnet provided below the disc so as to be radially arranged on a basis of the center of the disc, at least a portion of the magnet being opposite the metal ring in a vertical direction; and
a frame having a receiving portion for receiving the disc, wherein the magnet is radially arranged on the frame on a basis of a center of the receiving portion so as not to rotate.
2. The substrate processing apparatus according to claim 1, further comprising:
a bearing disposed so as to come into contact with each of the disc and the susceptor; and
wherein the metal ring rotates with respect to a third axis thereof by magnetic force of the magnet as the disc rotates with the respect to the first axis, whereby the susceptor rotates with respect to the second axis.

3. The substrate processing apparatus according to claim 2, wherein the susceptor includes a first support portion protruding from a lower surface thereof, the first support portion being coupled to the metal ring and being configured to support the bearing.

4. The substrate processing apparatus according to claim 3, wherein the metal ring includes:
an inner ring coupled to the first support portion;
an outer ring coupled to the inner ring; and
a ring coupling portion formed between the outer ring and the inner ring for coupling the outer ring and the inner ring to each other.

5. The substrate processing apparatus according to claim 4, wherein the outer ring is opposite the magnet in the vertical direction, and has a greater width than a width of the magnet.

6. The substrate processing apparatus according to claim 4, wherein the outer ring is opposite the magnet in the vertical direction, and includes a region opposite the magnet for covering the entire magnet in the vertical direction.

7. The substrate processing apparatus according to claim 1, wherein the magnet includes a plurality of pieces radially arranged at a constant interval.

8. The substrate processing apparatus according to claim 7, wherein the pieces have a cylindrical shape.

9. The substrate processing apparatus according to claim 1, further comprising:
a shaft inserted into a through-hole formed in a central region of the receiving portion for rotating the disc with respect to the first axis; and
a disc support portion coupled at a lower side thereof to an upper end of the shaft and at an upper side thereof to the disc.

10. The substrate processing apparatus according to claim 1, wherein a speed at which the susceptor rotates with respect to the second axis is proportional to a ratio of a diameter of the metal ring to a diameter of the magnet.

11. The substrate processing apparatus according to claim 10, wherein the diameter of the magnet is a value obtained by measuring in a diametrical direction a distance between opposite points on a width center of the magnet arranged in a ring shape, and the diameter of the metal ring is a value obtained by measuring in a diametrical direction a distance between opposite points on a width center of the metal ring.

12. The substrate processing apparatus according to claim 1, wherein the metal ring is formed of a ferromagnetic material.

13. The substrate processing apparatus according to claim 1, wherein a direction in which the disc rotates with respect to the first axis is the same as a direction in which the susceptor rotates with respect to the second axis.

14. The substrate processing apparatus according to claim 1, wherein the magnet, provided below the disc so as to be radially arranged on the basis of the center of the disc, has a center spaced apart from a center of the metal ring.

15. A substrate processing apparatus comprising:
a disc provided so as to be rotatable with respect to a first axis thereof;
a susceptor disposed on the disc such that a substrate is seated on an upper surface thereof, the susceptor being configured to rotate with respect to a second axis thereof and to revolve around a center of the disc as the disc rotates;
a metal ring coupled to a lower portion of the susceptor, the metal ring being arranged such that a center thereof coincides with a center of the susceptor; and
a magnet provided below the disc so as to be radially arranged on a basis of the center of the disc, the magnet being opposite the metal ring in a vertical direction,
wherein a speed at which the susceptor rotates with respect to the second axis is proportional to a ratio of a diameter of the metal ring to a diameter of the magnet.

16. A method of operating a substrate processing apparatus, the method comprising:
rotating a disc with respect to a first axis thereof;
revolving a susceptor around a center of the disc as the disc rotates with respect to the first axis;
revolving a metal ring, which is coupled to a lower portion of the susceptor, around the center of the disc as the susceptor revolves around the center of the disc;
magnetically attracting the metal ring using a magnet, the metal ring and the magnet being opposite each other in a vertical direction; and
causing the susceptor, which is coupled to the metal ring, to be attracted and rotated with respect to a second axis by the magnet due to magnetic attraction between the magnet and the metal ring,
wherein a speed at which the susceptor rotates with respect to the second axis is proportional to a ratio of a diameter of the metal ring to a diameter of the magnet.

17. The substrate processing apparatus according to claim 15, wherein the susceptor rotates with respect to the second axis in the same direction as a direction in which the disc rotates with respect to the first axis.

18. The substrate processing apparatus according to claim 15, wherein the metal ring includes a region for covering, in the vertical direction, the entire magnet having a ring shape.

* * * * *